US012356731B2

(12) United States Patent
Piel et al.

(10) Patent No.: US 12,356,731 B2
(45) Date of Patent: Jul. 8, 2025

(54) POLYPROPYLENE COMPOSITION FOR PRODUCING A LAYER OF A PHOTOVOLTAIC MODULE

(71) Applicant: BOREALIS AG, Vienna (AT)

(72) Inventors: Tanja Piel, Linz (AT); Bernt-Ake Sultan, Stenungsund (SE); Martina Sandholzer, Linz (AT); Klaus Bernreitner, Linz (AT)

(73) Assignee: BOREALIS AG, Vienna (AT)

( * ) Notice: Subject to any disclaimer, the term of this patent is extended or adjusted under 35 U.S.C. 154(b) by 0 days.

(21) Appl. No.: 15/308,202

(22) PCT Filed: May 11, 2015

(86) PCT No.: PCT/EP2015/060323
§ 371 (c)(1),
(2) Date: Nov. 1, 2016

(87) PCT Pub. No.: WO2015/173175
PCT Pub. Date: Nov. 19, 2015

(65) Prior Publication Data
US 2017/0077333 A1    Mar. 16, 2017

(30) Foreign Application Priority Data
May 12, 2014  (EP) .................................... 14167926

(51) Int. Cl.
*H10F 77/50*    (2025.01)
*B32B 9/04*    (2006.01)
(Continued)

(52) U.S. Cl.
CPC ........... *H10F 19/804* (2025.01); *B32B 9/045* (2013.01); *B32B 15/08* (2013.01); *B32B 27/08* (2013.01);
(Continued)

(58) Field of Classification Search
CPC ........ H10F 19/804; H10F 19/85; H10F 77/50; B32B 9/045; B32B 15/08; B32B 27/08;
(Continued)

(56) References Cited

U.S. PATENT DOCUMENTS

| 4,107,414 A | 8/1978 | Giannini et al. |
| 4,186,107 A | 1/1980 | Wagner |

(Continued)

FOREIGN PATENT DOCUMENTS

| CN | 101421346 A | 4/2009 |
| CN | 102099415 A | 6/2011 |

(Continued)

OTHER PUBLICATIONS

Office action for Japanese Application No. 2016-562989, dated Nov. 28, 2017.

(Continued)

*Primary Examiner* — Uyen M Tran
(74) *Attorney, Agent, or Firm* — Tarolli, Sundheim, Covell & Tummino LLP

(57) ABSTRACT

The present invention is directed to a layer of an electrical device a photovoltaic module comprising at least one photovoltaic element and at least one layer comprising a polypropylene composition and to the use of a polypropylene composition for producing at least one layer of an element of a photovoltaic module.

12 Claims, 2 Drawing Sheets

(51) Int. Cl.
*B32B 15/08* (2006.01)
*B32B 27/08* (2006.01)
*B32B 27/32* (2006.01)
*C08L 23/12* (2006.01)
*C08L 23/14* (2006.01)
*C09J 123/12* (2006.01)
*H10F 19/80* (2025.01)
*H10F 19/85* (2025.01)

(52) U.S. Cl.
CPC ............ *B32B 27/32* (2013.01); *B32B 27/322* (2013.01); *C08L 23/12* (2013.01); *C08L 23/142* (2013.01); *C09J 123/12* (2013.01); *H10F 19/85* (2025.01); *H10F 77/50* (2025.01); *B32B 2307/546* (2013.01); *B32B 2457/12* (2013.01); *C08L 2205/02* (2013.01); *C08L 2207/02* (2013.01)

(58) Field of Classification Search
CPC ........ B32B 27/32; C09J 123/12; C08L 23/12; C08L 23/142
See application file for complete search history.

(56) References Cited

U.S. PATENT DOCUMENTS

| | | | |
|---|---|---|---|
| 1,226,963 | A | 10/1980 | Giannini et al. |
| 4,347,160 | A | 8/1982 | Epstein et al. |
| 4,382,019 | A | 5/1983 | Greco |
| 4,435,550 | A | 3/1984 | Ueno et al. |
| 4,465,782 | A | 8/1984 | McKenzie |
| 4,472,524 | A | 9/1984 | Albizzati |
| 4,473,660 | A | 9/1984 | Albizzati et al. |
| 4,522,930 | A | 6/1985 | Albizzati et al. |
| 4,530,912 | A | 7/1985 | Pullukat et al. |
| 4,532,313 | A | 7/1985 | Matlack |
| 4,560,671 | A | 12/1985 | Gross et al. |
| 4,581,342 | A | 4/1986 | Johnson et al. |
| 4,657,882 | A | 4/1987 | Karayannis et al. |
| 5,539,067 | A | 7/1996 | Parodi et al. |
| 5,618,771 | A | 4/1997 | Parodi et al. |
| 2005/0268959 | A1* | 12/2005 | Aschenbrenner ... H01L 31/0508 136/244 |
| 2007/0059545 | A1* | 3/2007 | Emiliani ............. B32B 27/32 428/515 |
| 2008/0223428 | A1* | 9/2008 | Zeira ................ H01L 51/0005 136/244 |
| 2011/0272025 | A1* | 11/2011 | Cheng .................. B32B 27/32 136/259 |
| 2012/0111407 | A1* | 5/2012 | Rummens ......... B32B 17/10788 136/259 |
| 2013/0178586 | A1* | 7/2013 | Kock ................ C08F 297/086 525/53 |
| 2014/0174509 | A1* | 6/2014 | Bonekamp ........... B29C 41/003 136/251 |

FOREIGN PATENT DOCUMENTS

| | | |
|---|---|---|
| CN | 106255719 B | 11/2019 |
| EP | 0045975 A2 | 8/1981 |
| EP | 0045976 A2 | 8/1981 |
| EP | 0045977 A2 | 8/1981 |
| EP | 0491566 A2 | 12/1991 |
| EP | 0586390 B1 | 5/1997 |
| EP | 0591224 B1 | 2/1998 |
| EP | 0887379 A1 | 12/1998 |
| EP | 1820821 A1 | 8/2007 |
| EP | 2277694 A1 | 1/2011 |
| EP | 2610271 A1 | 12/2011 |
| JP | 2619680 B2 | 6/1997 |
| JP | 3656961 B2 | 6/2005 |
| JP | 2006-241260 A | 9/2006 |
| JP | 2010-050329 A | 3/2010 |
| JP | 2011-528052 A | 11/2011 |
| JP | 2013-165129 A | 8/2013 |
| JP | 2013-211391 A | 10/2013 |
| KR | 100622292 * | 9/2006 |
| KR | 20090066301 * | 6/2009 |
| TW | 201251069 A | 12/2012 |
| WO | 87/07620 A1 | 12/1987 |
| WO | 92/12182 A1 | 7/1992 |
| WO | 92/19653 A1 | 11/1992 |
| WO | 92/19658 A1 | 11/1992 |
| WO | 92/19659 A1 | 11/1992 |
| WO | 92/21705 A1 | 12/1992 |
| WO | 93/11165 A1 | 6/1993 |
| WO | 93/11166 A1 | 6/1993 |
| WO | 93/19100 A1 | 9/1993 |
| WO | 95/32994 A1 | 12/1995 |
| WO | 97/36939 A1 | 10/1997 |
| WO | 98/12234 A1 | 3/1998 |
| WO | 99/24478 A1 | 5/1999 |
| WO | 99/24479 A1 | 5/1999 |
| WO | 99/33842 A1 | 7/1999 |
| WO | 0039238 A1 | 7/2000 |
| WO | 00/68315 A1 | 11/2000 |
| WO | 03/000754 A1 | 1/2003 |
| WO | 03/000755 A2 | 1/2003 |
| WO | 03/000756 A1 | 1/2003 |
| WO | 03/000757 A1 | 1/2003 |
| WO | 2004/000899 A1 | 12/2003 |
| WO | 2004029112 A1 | 4/2004 |
| WO | 2004/111095 A1 | 12/2004 |
| WO | 2005040270 A1 | 5/2005 |
| WO | 2006/057361 A1 | 6/2006 |
| WO | 2006/095762 A1 | 9/2006 |
| WO | 2006111448 A1 | 10/2006 |
| WO | 2010006961 A1 | 1/2010 |
| WO | 2010104070 A1 | 9/2010 |
| WO | 20110009568 A1 | 1/2011 |
| WO | 2012/007430 A1 | 1/2012 |
| WO | 2012154803 A2 | 11/2012 |
| WO | WO-2013026745 A1 * | 2/2013 ............. C08L 23/10 |
| WO | 2013118570 A1 | 8/2013 |

OTHER PUBLICATIONS

Taiwanese Office Action dated Dec. 1, 2015.
Zweifel, Dr. Hans, "Plastics Additives Handbook", 5th Edition, 2011.
Examination Report for European Patent Application No. 15721255.6-1107, dated Sep. 19, 2018.
Applicant: Borealis AG; "Polypropylene Composition for Producing a Layer of a Photovoltaic Module"; Chinese Application No. 201911015947.9, Notice of Allowance for an Invention Patent; dated Nov. 21, 2022; 5 pgs.
Office action for Chinese Application No. 201911015947.9, dated Jul. 4, 2022.

* cited by examiner

POLYPROPYLENE COMPOSITION FOR PRODUCING A LAYER OF A PHOTOVOLTAIC MODULE

BACKGROUND ART

The present invention relates to a polypropylene composition for a layer element, to a layer of a monolayer or multilayer element, to photovoltaic module comprising a layer which comprises a polypropylene composition of the invention and to the use of the polypropylene composition of the invention for producing a layer of photovoltaic module.

Photovoltaic modules, also known as solar cell modules, produce electricity from light and are used in various kind of applications as well known in the field. The type of the photovoltaic module can vary. The modules have typically a multilayer structure, i.e. several different layer elements with different functions, and can be rigid or flexible. The layer elements of the photovoltaic module can vary with respect to layer materials and layer structure. The rigid photovoltaic module can for example contain a rigid glass top element, front encapsulation layer element, at least one element of photovoltaic cells together with connectors, back encapsulation layer element, a backsheet layer element and e.g. an aluminium frame. In flexible modules the top layer element can be e.g. a fluorinated layer made from polyvinylfluoride (PVF) or polyvinylidenefluoride (PVDF) polymer. The above exemplified layer elements can be monolayer or multilayer elements. Moreover, there may be adhesive layer(s) between the layers of an element or between the different layer elements.

Backsheet layer element may contain pigmented layer(s). Backsheet layer element functions typically as an insulation element. However, also photovoltaic modules with conductive backsheet layer element exist, depending on the type of the photovoltaic module.

The backsheet layer is typically a multilayer structure containing e.g. a layer of a fluorinated polymer, e.g. PVF or PVDF, polyamide or polyester. These solutions are costly and many of them have also limited insulation resistance, are easily hydrolysed and give rather high water vapour transmission rates. To compensate the above drawbacks, elements with multilayer structures, typically provided also with adhesive layer(s) between the layers, are needed. The multilayer structures complicate the manufacturing processes and also generate a risk for delamination when in use.

EP2277694 describes a photovoltaic module comprising a backsheet element which is a multilayer element wherein the protective layer comprises a flexible blend of polypropylene components. The polypropylene components in examples are commercial Hifax CA 10 A and Hifax CA 60 of LyondellBasell which according to public datasheet of the producer company have a vicat softening temperature of 60° C. or less (A50 (50° C./h 10 N)).

The technology of the photovoltaic modules is still developing considerably and there is a continuous need for different solutions for layer materials to meet the various demands in photovoltaic module field.

FIGURES

THE DESCRIPTION OF THE INVENTION

Figure 1:
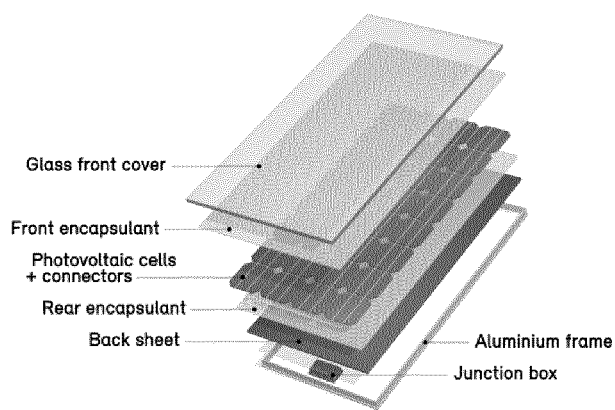
FIG. 1 illustrates schematically one example of a photovoltaic module.

Accordingly, the present invention is directed to a photovoltaic module comprising at least one photovoltaic element and at least one layer comprising, preferably consisting of, a polypropylene composition,
wherein the polypropylene composition comprises a heterophasic copolymer of propylene
(A) which comprises, preferably consists of,
a polypropylene matrix component and
an elastomeric propylene copolymer component which is dispersed in said polypropylene matrix,
and wherein the polypropylene polymer composition has
a xylene cold soluble (XCS) fraction in amount of 2 to 30 wt %, when measured according to ISO 16152 (at 25° C.),
a melt flow rate, $MFR_2$, of 0.2 to 20.0 g/10 min (ISO 1133, 2.16 kg load, 230° C.), and
a Vicat softening temperature of at least 140° C., when measured according to ASTM D 1525 method A.

The "polypropylene composition" is referred herein also as "composition of the invention". The "heterophasic copolymer of propylene (A)" is referred herein also as "PP copolymer (A)". The "polypropylene matrix component" is referred herein also as "matrix component". The "elastomeric propylene copolymer component" is referred herein also as "elastomeric component". The "xylene cold soluble (XCS) fraction" is referred herein also as "XCS fraction".

The "photovoltaic element" means that the element has photovoltaic activity. The photovoltaic element can be an element of photovoltaic cell(s) as well known in the art or e.g. a substrate layer on which is a layer or deposit with photovoltaic activity is subjected, for example a glass layer wherein ink material with photovoltaic activity is printed on one side thereof or a material with photovoltaic activity deposited on the substrate. For instance in so called thin film solutions of photovoltaic modules the ink with photovoltaic activity is printed on one side of a glass substrate.

The photovoltaic element is most preferably an element of photovoltaic cell(s).

"Photovoltaic cell(s)" means herein a layer element(s) of photovoltaic cells together with connectors.

The "at least one layer" means herein a layer which is other than layer known as an adhesive layer or as a sealing layer. Adhesive layer (sealing layer) is thinner than the abovementioned layer and is used to improve adhesion between two actual layers. Adhesive layer polymers preferably contain polar groups or are a blend of two or more polymer components, whereby at least one component contains polar groups.

Accordingly, the photovoltaic module of the invention comprises at least one layer comprising the composition of the invention and optionally one or more other layers, e.g. adhesive layer(s) comprising the composition of the invention.

It has surprisingly been found that the specific combination of the given xylene cold solubles (XCS) content (amorphous part), MFR and high Vicat softening temperature of the polypropylene composition of the invention provides a highly advantageous property combination, namely 1) a stiffness level (expressed as Flexural modulus as defined below), that is surprisingly useful in photovoltaic modules, 2) a high thermal stability both during lamination and at end use application, and 3) a very advantageous shrinkage behaviour. Moreover, a layer of the composition of the invention has excellent water protection (i.e. low water vapour transmission rate) and excellent electrical performance, as shown below under experimental part.

Accordingly, the polymer composition of the invention enables, if desired, to use more simple layer elements in photovoltaic modules, i.e. the layer elements can have less layers and/or thinner layers, whereby the thickness of the photovoltaic module can be reduced. Moreover, the formed layer, e.g. laminate, of the polypropylene composition has minimised or no shrinkage.

Furthermore, the composition of the invention provides a layer material which is highly feasible for the lamination process at high lamination temperatures. Additionally, the bubble formation in the obtained laminate can be avoided or minimised.

As said the polypropylene composition has also highly advantageous temperature stability at end use applications which can prolong the working life of the module.

Preferably, the polypropylene composition of the invention enables to produce multilayer elements, preferably backsheet multilayer elements, of a photovoltaic module, wherein the layer(s) of the backsheet element are free from fluoride containing polymer, such as layers of polyvinylidene fluoride polymer or of polyvinylfluoride polymer. Thus preferably the layer of the backsheet monolayer element or the layers of the multilayer backsheet element of the photovoltaic module of the invention is/are free from fluoride containing polymer.

Moreover, due to excellent mechanical and thermal properties, the composition of the invention enables to use multilayer elements in photovoltaic modules, which elements consist of polyolefin based layers. The polyolefin polymer(s) can comprise e.g. one or more monomers selected from ethylene and/or alpha-olefins and, optionally, one or more other comonomer selected from silane-containing monomer and polar comonomers. Optionally silane or polar functional groups, like maleic anhydride (MAH), can be grafted to a polyolefin of ethylene and/or alpha-olefin.

Generally, a heterophasic polypropylene is a propylene copolymer comprising a propylene homo polymer or propylene random copolymer matrix component (1) and an elastomeric copolymer component (2) of propylene with one or more of ethylene and/or C4-C8 alpha olefin copolymers, wherein the elastomeric (amorphous) copolymer component (2) is dispersed in said propylene homo or random copolymer matrix polymer (1).

Accordingly, the heterophasic copolymer of propylene (A) as used herein means that the elastomeric (amorphous) propylene copolymer component is (finely) dispersed in the polypropylene matrix component.

In case of the matrix component is a homopolymer of propylene, then the amount of the xylene cold soluble (XCS) fraction (amorphous fraction) (wt %) of the heterophasic copolymer of propylene (A) is understood in this application also as the amount of the elastomeric propylene copolymer component present in the PP copolymer (A). I.e., the XCS fraction of PP copolymer (A) is in practice, and regarded herein as, the elastomeric component, since the amount of XCS fraction in the matrix component is markedly lower.

The invention is further directed to a use of the composition of the invention as defined above or below for producing at least one layer of an element of a photovoltaic module.

The composition of the invention, the PP copolymer (A) of the invention, the at least one layer, the preferred layer of the mono- or multilayer element, of a photovoltaic module and the photovoltaic module of the invention are described below and claims with further details, preferred embodiments, ranges and properties, which preferred embodiments, ranges and properties can be combined in any order.

Polypropylene Composition and Heterophasic Copolymer of Propylene (A) of the Invention The polypropylene composition, preferably the heterophasic copolymer of propylene (A), has preferably a flexural modulus of at least 900 MPa, preferably of 950 to 3000 MPa, preferably of 1000 to 2400 MPa, preferably of 1100 to 2300 MPa, more preferably of 1200 to 2200, when measured according to ISO178 as described below under Determination methods.

The polypropylene composition, preferably the heterophasic copolymer of propylene (A), has preferably melting temperature of 158 to 170° C., preferably of 160 to 170° C., preferably of 163 to 170° C., more preferably of 164 to 169° C., when measured as described below under Determination methods.

The polypropylene composition, preferably the heterophasic copolymer of propylene (A), has preferably xylene cold soluble (XCS) fraction in amount of 2 to 30 wt %, preferably of 3 to 20 wt %, preferably of 4 to 17 wt %, more preferably 4 to 16 wt %, when measured as described below under Determination methods.

The polypropylene composition, preferably the heterophasic copolymer of propylene (A), has preferably $MFR_2$ of 0.2 to 15.0 g/10 min, preferably of 0.3 to 10 g/10 min, when measured as described below under Determination methods. The MFR contributes to the processability and mechanical properties of the polypropylene composition.

The polypropylene composition, preferably the heterophasic copolymer of propylene (A), has preferably Vicat softening temperature of at least 145° C., preferably of 148 to 165° C., more preferably of 150 to 168° C., when measured as described below under Determination methods.

The heterophasic copolymer of propylene (A) has a comonomer content of 0.5 to 20 wt %, preferably of 1.0 to 20 wt %, preferably of 1.2 to 10 wt %, more preferably of 2.0 to 10 wt %, more preferably of 2 to 8 wt %, when measured as described below under Determination methods. The comonomer(s) is preferably selected from ethylene and/or C4-C8 alpha olefin comonomers, preferably from ethylene.

The polypropylene matrix component of the heterophasic copolymer of propylene (A) may be a unimodal or a multimodal random copolymer or homopolymer of propylene which both have a well-known meaning. Multimodal random copolymer or homopolymer of propylene means herein that it has at least two polymer fractions which are different e.g. with one or two of the following properties: 1) weight average molecular weight or 2) MFR. In case of random copolymer of propylene as the matrix component, the copolymer can also be multimodal with respect to 3) comonomer content, optionally in combination with any or both of the above differences 1) and 2).

The matrix component of the PP copolymer (A) can be a homopolymer or random copolymer of propylene. It is preferred that the matrix component of the PP copolymer (A) is a homopolymer of propylene.

Accordingly, it is preferred that all the comonomers as defined above which are present in the PP copolymer (A) originate from the elastomeric propylene copolymer component.

The PP copolymer (A) has preferably xylene cold soluble (XCS) fraction in amount of preferably 3 to 20 wt %. In case of preferred embodiment, wherein the matrix component is a homopolymer of propylene, the XCS content represents the amount (wt %) of the elastomeric component of the PP copolymer (A).

It is preferred that the PP copolymer (A) consists of the matrix component and the elastomeric component. The PP copolymer (A) may optionally comprise a prepolymer fraction, as well known in the polymer field. In such case the amount of the prepolymer is calculated to the amount of the matrix component.

Furthermore, it is preferred that the layer of an electrical device, or the preferred at least one layer of the photovoltaic module, comprises a PP copolymer (A) which is non-grafted. Non-grafted means that said PP copolymer (A) is not grafted with functional groups, such as polar groups, like maleic acid anhydride (MAH) groups, or silane containing groups.

Naturally, the element(s) of the photovoltaic module of the invention may, in addition to the layer of an electrical device, or the preferred at least one layer of the photovoltaic module, contain other layer(s) which comprise the PP copolymer (A) of the invention which is grafted.

The composition of the invention may comprise further polymer components that are different from the PP copolymer (A). As an example further polymer components are other polyolefin components different from PP copolymer (A), such as homo or copolymers of ethylene or C3 to C8 alpha olefins together with comonomer(s) other than the first monomer. Most preferably the polymeric components present in the composition of the invention consist of the PP copolymer (A) only. "Polymeric components" excludes herein any carrier polymers of additive products, e.g. master batches of additives together with the carrier polymer, optionally present in the composition of the invention. Such optional carrier polymers are calculated to the amount of the respective additive based on the amount (100%) of the composition of the invention.

Accordingly, in one embodiment the composition of the invention preferably comprises additives other than fillers (like flame retardants (FRs)), then the composition of the invention comprises, based on the total amount (100 wt %) of the propylene copolymer composition, 90 to 99.9999 wt % of the PP copolymer (A) and
0.0001 to 10 wt % of optional, and preferable additives.

The total amount of optional and preferable additives is preferably between 0.0001 and 5.0 wt %, preferably 0.0001 and 2.5 wt %

As to optional and preferable additives, composition of the invention may contain further additives, preferably conventional additives for photovoltaic module applications, including without limiting to, antioxidants, UV light stabilisers, nucleating agents, clarifiers, brighteners, acid scavengers, as well as slip agents, pigments, like carbon black, titanium oxide and talc etc. Each additive can be used e.g. in conventional amounts, the total amount of additives present in the propylene composition being preferably as defined below. Such additives are generally commercially available and are described, for example, in "Plastic Additives Handbook", 5th edition, 2001 of Hans Zweifel.

In another embodiment the composition of the invention comprises in addition to optional and preferable additives as defined above also fillers, such as FRs with flame retarding amounts or carbon black with high amounts, then the composition of the invention comprises, based on the total amount (100 wt %) of the propylene copolymer composition, 30 to 90 wt %, preferably 40 to 70 wt %, of the PP copolymer (A) and
10 to 70 wt %, preferably 30 to 60 wt %, of filler(s) and optional, and preferable additives.

As non-limiting examples, the fillers comprise Flame Retardants, such as magensiumhydroxide, ammonium polyphosphate etc.

The PP copolymer (A) can be commercially available grade or can be produced e.g. by conventional polymerisation processes.

As to polymerisation of the heterophasic copolymer of propylene (A), the individual components (matrix and elastomeric components) of PP copolymer (A) can be produced separately and blended mechanically by mixing in a mixer or extruder. However it is preferred that the PP copolymer (A) comprising the matrix component and the elastomeric component are produced in a sequential process, using reactors in serial configuration and operating at different reaction conditions. As a consequence, each fraction prepared in a specific reactor will have its own molecular weight distribution, MFR and/or comonomer content distribution.

The heterophasic copolymer of propylene (A) according to this invention is preferably produced in a sequential polymerisation process, i.e. in a multistage process, known in the art, wherein the matrix component is produced at least in one slurry reactor, preferably at least in a slurry reactor, and optionally, and preferably in a subsequent gas phase reactor, and subsequently the elastomeric component is produced at least in one, i.e. one or two, gas phase reactor(s) (gpr), preferably in one gpr.

Accordingly it is preferred that the PP copolymer (A) is produced in a sequential polymerisation process comprising the steps of (a) polymerising propylene and optionally at least one ethylene and/or C4 to C12 α-olefin, preferably propylene as the only monomer, in the presence of a catalyst in a first reactor (R1), (b) transferring the reaction mixture of the polymerised first polypropylene, preferably propylene homopolymer, fraction together with the catalyst, into a second reactor (R2), (c) polymerising in the second reactor (R2) and in the presence of said first polypropylene polymer, propylene and optionally at least one ethylene and/or C4 to C12 α-olefin, preferably propylene as the only monomer, in obtaining thereby the second polypropylene fraction, preferably said second polypropylene fraction is a second propylene homopolymer, whereby said first polypropylene fraction and said second polypropylene fraction form the matrix component of the PP copolymer (A), (d) transferring the reaction mixture of the polymerised matrix component of step (c) into a third reactor (R3), (e) polymerising in the third reactor (R3) and in the presence of the matrix component obtained in step (c), propylene and at least one ethylene and/or C4 to C12 α-olefin obtaining thereby the elastomeric component of PP copolymer (A), wherein the elastomeric propylene copolymer component is dispersed in said matrix component.

Optionally the elastomeric component can be produced in two reactors, whereby after above step (e), (f) transferring the polypropylene (PP) in which the first elastomeric propylene copolymer fraction is dispersed in a fourth reactor (R4), and (g) polymerising in the fourth reactor (R4) and in the presence of the mixture obtained in step (e) propylene and at least one ethylene and/or C4 to C12 α-olefin obtaining thereby the second elastomeric propylene copolymer fraction, whereby the polypropylene (PP), the first elastomeric propylene copolymer fraction, and the second elastomeric propylene copolymer fraction form the PP copolymer (A).

Preferably between the second reactor (R2) and the third reactor (R3) the monomers are flashed out.

The term "sequential polymerisation process" indicates that the heterophasic copolymer of propylene (A) is produced in at least two, like three, reactors connected in series.

Accordingly the present process comprises at least a first reactor (R1) and a second reactor (R2), more preferably a first reactor (R1), a second reactor (R2), a third reactor (R3) and optionally a fourth reactor (R4). The term "polymerisation reactor" shall indicate one of the main polymerisation steps. Thus in case the process consists of four polymerisation reactors, this definition does not exclude the option that the overall process comprises for instance a prepolymerisation step in a prepolymerisation reactor. The term "consist of" is only a closing formulation in view of the main polymerisation reactors.

Any prepolymer fraction is counted into the amount of the first polypropylene fraction.

The first reactor (R1) is preferably a slurry reactor (SR) and can be any continuous or simple stirred batch tank reactor or loop reactor operating in bulk or slurry. Bulk means a polymerisation in a reaction medium that comprises of at least 60% (w/w) monomer. According to the present invention the slurry reactor (SR) is preferably a (bulk) loop reactor (LR).

The second reactor (R2), the third reactor (R3) and the optional fourth reactor (R4) are preferably gas phase reactors (GPR). Such gas phase reactors (GPR) can be any mechanically mixed or fluid bed reactors. Preferably the gas phase reactors (GPR) comprise a mechanically agitated fluid bed reactor with gas velocities of at least 0.2 m/sec. Thus it is appreciated that the gas phase reactor is a fluidized bed type reactor preferably with a mechanical stirrer.

Thus in a preferred embodiment the first reactor (R1) is a slurry reactor (SR), like a loop reactor (LR), whereas the second reactor (R2), the third reactor (R3) and the optional fourth reactor (R4) are gas phase reactors (GPR). Accordingly for the instant process at least three, namely a slurry reactor (SR), like a loop reactor (LR), a first gas phase reactor (GPR-1), a second gas phase reactor (GPR-2) and an optional a third gas phase reactor (GPR-3) connected in series are used. In case of a prepolymerisation step a pre-polymerisation reactor is placed prior to the slurry reactor (SR).

A preferred multistage process is a "loop-gas phase"-process, such as developed by Borealis A/S, Denmark (known as BORSTAR® technology) described e.g. in patent literature, such as in EP 0 887 379, WO 92/12182 WO 2004/000899, WO 2004/111095, WO 99/24478, WO 99/24479 or in WO 00/68315.

A further suitable slurry-gas phase process is the Spheripol® process of LyondellBasell.

Preferably, in the instant process for producing the heterophasic copolymer of propylene (A) as defined above the conditions for the first reactor (R1), i.e. the slurry reactor (SR), like a loop reactor (LR), of step (a) may be as follows:
the temperature is within the range of 50° C. to 110° C., preferably between 60° C. and 100° C., more preferably between 68 and 95° C.,
the pressure is within the range of 20 bar to 80 bar, preferably between 40 bar to 70 bar,
hydrogen can be added for controlling the molar mass in a manner known per se.

Subsequently, the reaction mixture from step (a) is transferred to the second reactor (R2), i.e. gas phase reactor (GPR-1), i.e. to step (c), whereby the conditions in step (c) are preferably as follows:

the temperature is within the range of 50° C. to 130° C., preferably between 60° C. and 100° C.,
the pressure is within the range of 5 bar to 50 bar, preferably between 15 bar to 35 bar,
hydrogen can be added for controlling the molar mass in a manner known per se.

The condition in the second gas phase reactor (GPR-2) and in the optional third gas phase reactor (GPR-3) are similar to the second reactor (R2) (=first gas phase reactor (GPR-1).

The residence time can vary in the three reactor zones.

In one embodiment of the process for producing the matrix component of the PP copolymer (A) the residence time in bulk reactor, e.g. loop is in the range 0.1 to 2.5 hours, e.g. 0.15 to 1.5 hours and the residence time in gas phase reactor will generally be 0.2 to 6.0 hours, like 0.5 to 4.0 hours.

If desired, the polymerisation may be effected in a known manner under supercritical conditions in the first reactor (R1), i.e. in the slurry reactor (SR), like in the loop reactor (LR), and/or as a condensed mode in the gas phase reactors (GPR).

Preferably the process comprises also a prepolymerisation with the catalyst system, as described in detail below, comprising a Ziegler-Natta procatalyst, an external donor and optionally a cocatalyst.

In a preferred embodiment, the prepolymerisation is conducted as bulk slurry polymerisation in liquid propylene, i.e. the liquid phase mainly comprises propylene, with minor amount of other reactants and optionally inert components dissolved therein.

The prepolymerisation reaction is typically conducted at a temperature of 10 to 60° C., preferably from 15 to 50° C., and more preferably from 20 to 45° C.

The pressure in the prepolymerisation reactor is not critical but must be sufficiently high to maintain the reaction mixture in liquid phase. Thus, the pressure may be from 20 to 100 bar, for example 30 to 70 bar.

The catalyst components are preferably all introduced to the prepolymerisation step. However, where the solid catalyst component (i) and the cocatalyst (ii) can be fed separately it is possible that only a part of the cocatalyst is introduced into the prepolymerisation stage and the remaining part into subsequent polymerisation stages. Also in such cases it is necessary to introduce so much cocatalyst into the prepolymerisation stage that a sufficient polymerisation reaction is obtained therein.

It is possible to add other components also to the prepolymerisation stage. Thus, hydrogen may be added into the prepolymerisation stage to control the molecular weight of the prepolymer as is known in the art. Further, antistatic additive may be used to prevent the particles from adhering to each other or to the walls of the reactor.

The precise control of the prepolymerisation conditions and reaction parameters is within the skills of the skilled person.

After heterophasic copolymer of propylene (A) has been removed from the last polymerisation stage, it is preferably subjected to process steps for removing the residual hydrocarbons from the polymer. Such processes are well known in the art and can include pressure reduction steps, purging steps, stripping steps, extraction steps and so on. Also combinations of different steps are possible. After the removal of residual hydrocarbons the PP copolymer (A) is preferably mixed with additives as it is well known in the art. Such additives are described below under the polymer composition of the invention. The polymer particles are then extruded to pellets as it is known in the art. Preferably co-rotating twin screw extruder is used for the extrusion step. Such extruders are manufactured, for instance, by Coperion (Werner & Pfleiderer) and Japan Steel Works.

The PP copolymer (A) of the invention is preferably produced by polymerisation using any suitable Ziegler-Natta type. Typical suitable Ziegler-Natta type catalyst is stereospecific, solid high yield Ziegler-Natta catalyst component comprising as essential components Mg, Ti and Cl. In addition to the solid catalyst a cocatalyst(s) as well external donor(s) are typically used in polymerisation process.

Components of catalyst may be supported on a particulate support, such as inorganic oxide, like silica or alumina, or, usually, the magnesium halide may form the solid support. It is also possible that catalysts components are not supported on an external support, but catalyst is prepared by emulsion-solidification method or by precipitation method.

Alternatively the PP copolymer (A) of the invention can be produced using a modified catalyst system as described below.

More preferably, a vinyl compound of the formula (I) is used for the modification of the catalyst:

$$CH_2=CH-CHR1R2 \quad (I)$$

wherein R1 and R2 together form a 5- or 6-membered saturated, unsaturated or aromatic ring, optionally containing substituents, or independently represent an alkyl group comprising 1 to 4 carbon atoms, whereby in case R1 and R2 form an aromatic ring, the hydrogen atom of the —CHR1R2 moiety is not present.

More preferably, the vinyl compound (I) is selected from: vinyl cycloalkane, preferably vinyl cyclohexane (VCH), vinyl cyclopentane, 3-methyl-1-butene polymer and vinyl-2-methyl cyclohexane polymer. Most preferably the vinyl compound (I) is vinyl cyclohexane (VCH) polymer.

The solid catalyst usually also comprises an electron donor (internal electron donor) and optionally aluminium. Suitable internal electron donors are, among others, esters of carboxylic acids or dicarboxylic acids, like phthalates, maleates, benzoates, citraconates, and succinates, 1,3-diethers or oxygen or nitrogen containing silicon compounds. In addition mixtures of donors can be used.

The cocatalyst typically comprises an aluminium alkyl compound. The aluminium alkyl compound is preferably trialkyl aluminium such as trimethylaluminium, triethylaluminium, tri-isobutylaluminium or tri-n-octylaluminium. However, it may also be an alkylaluminium halide, such as diethylaluminium chloride, dimethylaluminium chloride and ethylaluminium sesquichloride.

Suitable external electron donors used in polymerisation are well known in the art and include ethers, ketones, amines, alcohols, phenols, phosphines and silanes. Silane type external donors are typically organosilane compounds containing Si—OCOR, Si—OR, or Si—NR$_2$ bonds, having silicon as the central atom, and R is an alkyl, alkenyl, aryl, arylalkyl or cycloalkyl with 1-20 carbon atoms are known in the art.

Examples of suitable catalysts and compounds in catalysts are shown in among others, in WO 87/07620, WO 92/21705, WO 93/11165, WO 93/11166, WO 93/19100, WO 97/36939, WO 98/12234, WO 99/33842, WO 03/000756, WO 03/000757, WO 03/000754, WO 03/000755, WO 2004/029112, EP 2610271, WO 2012/007430. WO 92/19659, WO 92/19653, WO 92/19658, U.S. Pat. Nos. 4,382,019, 4,435,550, 4,465,782, 4,473,660, 4,560,671, 5,539,067, 5,618,771, EP45975, EP45976, EP45977, WO 95/32994, U.S. Pat. Nos. 4,107,414, 4,186,107, 4,226,963, 4,347,160, 4,472,524, 4,522,930, 4,530,912, 4,532,313, 4,657,882, 4,581,342, 4,657,882.

Photovoltaic Module

Preferably, the at least one layer of the photovoltaic module of the invention is a layer of a monolayer or multilayer element of a photovoltaic module.

Accordingly, it is preferred that the layer comprising, preferably consisting of, the polymer composition, which comprises, preferably consists of the heterophasic copolymer of propylene (A) as the only polymeric component(s), is a layer of a multilayer element of the photovoltaic module.

In one preferable embodiment said layer of the photovoltaic module comprising, preferably consisting of, the polymer composition, which comprises, preferably consists of the heterophasic copolymer of propylene (A) as the only polymeric component(s), is a laminated layer of a multilayer element.

In another equally preferable embodiment said layer of the photovoltaic module comprising, preferably consisting of, the polymer composition, which comprises, preferably consists of the heterophasic copolymer of propylene (A) as the only polymeric component(s), is a coextruded layer of a multilayer element.

It is preferred that said layer comprising, preferably consisting of, the polymer composition, which comprises, preferably consists of the heterophasic copolymer of propylene (A) as the only polymeric component(s), is a layer of a backsheet element, preferably a laminated or a coextruded layer of a backsheet multilayer element of a photovoltaic module.

Preferably, the layer of the backsheet monolayer element or the layers of the multilayer backsheet element of the photovoltaic module of the invention is/are free from fluoride containing polymer.

The thickness of the backsheet element is preferably 0.02 to 2 mm, more preferably 0.1 to 1 mm and most preferably 0.2 to 0.5 mm.

As well known, the elements and the layer structure of the photovoltaic module of the invention can vary depending on the desired type of the module. The photovoltaic module can be rigid or flexible. One preferable photovoltaic module of the invention comprises a protective top element, e.g. a glass front sheet (glass front cover), front encapsulation element (front encapsulant), element(s) of photovoltaic cells (photovoltaic cells+connectors), back encapsulation element (rear encapsulant), backsheet element, preferably backsheet multilayer element, and optionally a protective cover, like a metal frame, such as aluminium frame (with junction box). Moreover, the above elements can be monolayer elements or multilayer elements.

Preferably at least one layer of the backsheet element, preferably of the backsheet multilayer element, comprises, preferably consists of, the composition of the invention.

The above photovoltaic module may have further layer element(s) in addition to above mentioned elements. Moreover, the layers of said layer elements may be multilayer elements and comprise also adhesive layers for improving the adhesion of the layers of the multilayer element. There can be adhesive layers also between the different elements. As already mentioned above, an optional adhesive layer may comprise the composition of the invention, e.g. as a blend with polar components. Or the optional adhesive layer may comprise the composition of the invention, wherein the PP copolymer (A) is grafted with polar functionalities.

The glass sheets, the photovoltaic element, which is preferably element(s) of photovoltaic cells together with connectors, and further materials for layers for encapsulation element(s) and for the backsheet element usable with the present layer of the composition of the invention are e.g. well known in the photovoltaic module field and are commercially available or can be produced according to or in accordance to the methods known in the literature for the photovoltaic module filed.

FIG. 1 illustrates the above embodiment of the photovoltaic module of the invention.

The photovoltaic module of the invention can be produced in a manner well known in the field of the photovoltaic modules. The polymeric layer elements including the backsheet element are produced for example by extrusion, preferably by cast film extrusion, in a conventional manner using the conventional extruder and film formation equipment. The multilayer elements can be partly or fully be coextruded or laminated.

The different elements of the photovoltaic module are typically assembled together by conventional means to produce the final photovoltaic module. Elements can be provided separately or partly in integrated form to such assembly step. The different elements are then typically attached together by lamination using the conventional lamination techniques in the field.

The assembly of photovoltaic module is well known in the field of photovoltaic modules.

Determination Methods

Melt Flow Rate: The melt flow rate (MFR) is determined according to ISO 1133 and is indicated in g/10 min. The MFR is an indication of the flowability, and hence the processability, of the polymer. The higher the melt flow rate, the lower the viscosity of the polymer. The $MFR_2$ of polypropylene is measured at a temperature 230° C. and a load of 2.16 kg.

Density: ISO 1183, measured on compression moulded plaques

Comonomer Content: The comonomer content was determined by quantitative Fourier transform infrared spectroscopy (FTIR) after basic assignment calibrated via quantitative $^{13}C$ nuclear magnetic resonance (NMR) spectroscopy in a manner well known in the art. Thin films are pressed to a thickness of between 100-500 micrometer and spectra recorded in transmission mode.

Specifically, the ethylene content of a polypropylene-co-ethylene copolymer is determined using the baseline corrected peak area of the quantitative bands found at 720-722 and 730-733 $cm^{-1}$. Specifically, the butene or hexene content of a polypropylene copolymer is determined using the baseline corrected peak area of the quantitative bands found at 1377-1379 $cm^{-1}$. Quantitative results are obtained based upon reference to the film thickness. The comonomer content is herein assumed to follow the mixing rule (equation 2):

$$C_b = w_1 \cdot C_1 + w_2 \cdot C_2 \quad \text{(eq. 2)}$$

Where C is the content of comonomer in weight-%, w is the weight fraction of the component in the mixture and subscripts b, 1 and 2 refer to the overall mixture, component 1 and component 2, respectively.

As it is well known to the person skilled in the art the comonomer content in weight basis in a binary copolymer can be converted to the comonomer content in mole basis by using the following equation $$c_m = \frac{1}{1 + \left(\frac{1}{c_w} - 1\right) \cdot \frac{MW_c}{MW_m}} \quad \text{(eq. 3)}$$

where $c_m$ is the mole fraction of comonomer units in the copolymer, $c_w$ is the weight fraction of comonomer units in the copolymer, $MW_c$ is the molecular weight of the comonomer (such as ethylene) and $MW_m$ is the molecular weight of the main monomer (i.e., propylene).

Melting Temperature ($T_m$) and Heat of Fusion ($H_f$): measured with Mettler TA820 differential scanning calorimetry (DSC) on 5 to 10 mg samples. DSC is run according to ISO 3146/part 3/method C2 in a heat/cool/heat cycle with a scan rate of 10° C./min (heating and cooling) in the temperature range of +23 to +210° C. The melting temperature and heat of fusion ($H_f$) are determined from the second heating step. The melting temperatures were taken as the peaks of endotherms.

Flexural Modulus: The flexural modulus was determined according to ISO 178. The test specimens having a dimension of 80×10×4.0 $mm^3$ (length×width×thickness) were prepared by injection molding according to EN ISO 1873-2. The length of the span between the supports was 64 mm, the test speed was 2 mm/min and the force was 100 N.

Xylene Cold Soluble (XCS): The amount of xylene cold soluble fraction was determined according to ISO 16152. The amount of polymer which remains dissolved at 25° C. after cooling is given as the amount of xylene soluble polymer.

The content of xylene soluble polymer is herein assumed to follow the mixing rule (equation 4):

$$XS_b = w_1 \cdot XS_1 + w_2 \cdot XS_2 \quad \text{(eq. 4)}$$

Where XCS is the content of xylene soluble polymer in weight-%, w is the weight fraction of the component in the mixture and subscripts b, 1 and 2 refer to the overall mixture, component 1 and component 2, respectively.

Charpy Impact Strength Notched: NIS was determined according to ISO 179-1eA:2000 on V-notched samples of 80×10×4 $mm^3$ at 23° C., 0° C., −10° C. or −20° C., as specified in the experimental part. The test specimens were prepared by injection moulding using an IM V 60 TECH machinery in line with EN ISO 1873-2 (80*10×4 $mm^3$).

The melt temperature was 200° C. and the mould temperature was 40° C.

Tensile Modulus: Tensile Stress at Yield and Tensile Strain at Break: are measured according to ISO 527-2:1996 (cross head speed=1 mm/min; 23° C.) using dogbone shape pressed out of the film samples prepared as described under experimental part. Dogbone dimensions: an overall length of 71 mm, an overall width of 14 mm, a length of the narrow section of 25 mm, and a width of the narrow section of 5 mm.

Breakdown Voltage: The electrical breakdown at 50 Hz and at an voltage increase of 2 kV/s was measured on 50×50 mm cut out of respective back sheets. Stainless steel electrodes in accordance with EN 60243 and with a diameter of 25 mm and edges rounded to a radious of 3 mm was used. The test was performed at 22° C. in mineral oil (Shell Diala). The trip current was 5 mA.

Water Vapour Transmission Rate: Water vapour transmission was measured at 23° C. and a relative humidity of 85% according to ISO 15106-3.

Adhesion (Peel Strength) Between Encapsulant and Backsheet

A teflon film was placed between the glass and the outer encapsulant layer to avoid adhesion towards the glass. At this point 15 mm wide stripes was cut out and tested at 50 mm/minutes at room temperature with a Zwick tensile testing machine. The calculated peel strength is an average of three samples.

Intrinsic Viscosity: Intrinsic viscosity was measured according to DIN ISO 1628-1 (October 1999) in Decalin at 135° C.

Vicat Softening Temperature: measured according to ASTM D 1525 method A (50° C./h, 10N).

Experimental Part

A. Testing of the Compositions of the Invention (Inv. 1-Inv. 5)

Inventive 1 (Inv. 1)

Polymerisation of a Heterophasic Copolymer of Propylene (A)

Catalyst Preparation:

First, 0.1 mol of $MgCl_2 \times 3$ EtOH was suspended under inert conditions in 250 ml of decane in a reactor at atmospheric pressure. The solution was cooled to the temperature of −15° C. and 300 ml of cold $TiCl_4$ was added while maintaining the temperature at said level. Then, the temperature of the slurry was increased slowly to 20° C. At this temperature, 0.02 mol of diethylhexylphthalate (DOP) was added to the slurry. After the addition of the phthalate, the temperature was raised to 135° C. during 90 minutes and the slurry was allowed to stand for 60 minutes. Then, another 300 ml of $TiCl_4$ was added and the temperature was kept at 135° C. for 120 minutes. After this, the catalyst was filtered from the liquid and washed six times with 300 ml heptane at 80° C. Then, the solid catalyst component was filtered and dried. Catalyst and its preparation concept is described in general e.g. in patent publications EP 491 566, EP 591 224 and EP 586 390.

Then triethylaluminium (TEAL), dicyclopentyldimethoxysilane (DCPDMS) as donor (Do), catalyst as produced above and vinylcyclohexane (VCH) were added into oil, like mineral oil, e.g. Technol 68 (kinematic viscosity at 40° C. 62-74 cSt), in amounts so that Al/Ti was 3-4 mol/mol, Al/Do was as well 3-4 mol/mol, and weight ratio of VCH/solid catalyst was 1:1. The mixture was heated to 60-65° C. and allowed to react until the content of the unreacted vinylcyclohexane in the reaction mixture was less than 1000 ppm. Catalyst concentration in the final oil-catalyst slurry was 10-20 wt %.

Polymerisation

In example Inv. 1 the matrix was made of a propylene homopolymer which was prepared in a loop reactor and a gas phase reactor (GPR1). The obtained polymer was stabilised with conventional stabiliser and antioxidant. Further information about the propylene homopolymer constituting the matrix is shown in Table 1.

Subsequently, the propylene homopolymer was transferred to a second gas phase reactor (GPR2) where the elastomeric polypropylene was prepared. The obtained polymer was stabilised in a conventional twin screw extruder with conventional stabilisers, i.e. calcium stearate and phenolic antioxidant, in conventional amounts, and pelletised for further testing as given below.

TABLE 1

| Process parameters | Inv.1 |
|---|---|
| Catalyst feed (g/h) | 5.0 |
| Ti content % | 1.9 |
| Donor feed (g/t propylene) | 80 |
| Al/Ti ratio (mol/mol) | 127 |
| Al/donor ratio (mol/mol) | 5.0 |

TABLE 1-continued

| Process parameters | Inv.1 |
|---|---|
| Prepolymerisation | |
| Temperature (° C.) | 40 |
| Hydrogen feed (g/h) | 0.5 |
| Loop reactor | |
| Temperature (° C.) | 85 |
| Pressure (kPa) | 5462 |
| H2/C3 ratio (mol/kmol) | 0.07 |
| MFR10 (g/10 min) | 1.1 |
| Gas phase reactor 1 | |
| Temperature (° C.) | 95 |
| Pressure (kPa) | 2301 |
| H2/C3 ratio (mol/kmol) | 214 |
| MFR2 (g/10 min) | 0.33 |
| Gas phase reactor 2 | |
| Temperature (° C.) | 60 |
| Pressure (kPa) | 2000 |
| C2/C3 ratio (mol/kmol) | 700 |
| H2/C2 ratio (mol/kmol) | 14 |

Inventive 2 (Inv. 2)

Polymerisation of a Heterophasic Copolymer of Propylene (A)

1. Matrix Component: Homopolymer of Propylene

Catalyst:

The Ziegler-Natta catalyst, ZN104, commercially available from Basell.

Polymerisation

A 5 l autoclave reactor was purified by mechanical cleaning, washing with hexane and heating under vacuum/N2 cycles at 160° C. After testing for leaks with 30 bar N2 overnight reactor was vacuumed and filled with 1110 g propylene by weighing and 8 ml H2 by pressure monitoring from a 50l steel cylinder. 10 mg of ZN104-catalyst was activated for 10 minutes with a mixture of Triethylaluminium (TEA1; solution in hexane 1 mol/l) and Dicyclopentyldimethoxysilane as donor (0.3 mol/l in hexane)—in a molar ratio of 5 after a contact time of 5 min—and 10 ml hexane in a catalyst feeder. The molar ratio of TEA1 and Ti of catalyst was 250. After activation the catalyst was spilled with 300 g propylene into the stirred reactor with a temperature of 23° C. Stirring speed was hold at 250 rpm. After 6 min prepolymerisation at 23° C. temperature was increased to 70° C. in about 14 min. After holding that temperature for 1 hour polymerisation was stopped by flashing propylene and cooling to room temperature.

After spilling the reactor with N2 the homopolymer powder was transferred to a steel container and stabilized with conventional stabilisers, i.e. calcium stearate and phenolic antioxidant, in conventional amounts.

The amount of homopolymer of propylene powder (matrix component) was 113 g and the MFR (230° C., 2.16 kg) of the powder was 3 g/10 min.

2. Elastomeric Component: Propylene Copolymer with Ethylene

Catalyst

The Ziegler-Natta catalyst ZN101 is commercially available from Basell.

Polymerisation

A 5 l reactor (autoclave) filled with about 0.2 barg propylene (polymerisation grade) was pressured up with the required amount of H2 in order to achieve the targeted intrinsic viscosity of the elastomeric copolymer. Then 300 g of propylene was added. 5 mg of a ZN101-catalyst was contacted with 0.3 ml white oil for about 16 hours and then activated for 5 minutes with a mixture of Triethylaluminium (TEA1; solution in hexane 1 mol/l) and an alkoxysilane (Dicyclopentyldimethoxysilan in the examples) as donor (0.3 mol/l in hexane)—in a molar ratio of 76 using a contact time of 5 min. The molar ratio of TEA1 and Ti of catalyst was 380 and TEA1 concentration in TEA1/donor mixture 12.6 mg/ml hexane. After activation the catalyst was transferred to the reactor by spilling in with 500 g propylene. After 12 min prepolymerisation at 30° C. a specified amount of ethylene was added to the reactor and the temperature was increased to the target polymerisation temperature (55° C. in the examples). During heating up additional ethylene dosing was started to achieve the target total pressure at the target polymerisation temperature. Total pressure was hold constantly via continuously dosing of ethylene during polymerisation. The reaction was stopped 30 min after end of prepolymerisation by flashing of monomers and cooling.

The obtained elastomeric component was stabilized with conventional stabilisers, i.e. calcium stearate and phenolic antioxidant, in conventional amounts.

TABLE 2

Polymerisation conditions and polymer properties of the obtained elastomeric component

| | $H_2$ [barg] | C2 [g] | Total pressure [barg] | | IV [dl/g] | C3 [wt %] |
|---|---|---|---|---|---|---|
| Polymerisation conditions | 3.7 | 60 | 30 | Properties of the elastomeric component | 1.8 | 71 |

The 86 wt % of the matrix component and 14 wt % of the elastomeric component were compounded in a laboratory scale twin screw extruder in a conventional manner and pelletised to obtain the Inv. 2. The pellets of the inventive PP copolymer (A) were used for property measurements and for the testing as given below.

Inventive 3 (Inv. 3), Inventive 4 (Inv. 4) and Inventive 5 (Inv. 5): Commercially available heterophasic copolymers of propylene grades, supplied by Borealis AG, and used as the inventive compositions. The properties are given in the below table 3:
Inv. 3: BA110CF Grade
Inv. 4: BD712CF Grade
Inv. 5: BD212CF Grade The comparative examples were produced using the same process as the inventive polymer 1:
Comp. 1: random copolymer of propylene
Comp. 2: homopolymer of propylene
Table 3 and Table 4 show the properties of the inventive examples and, respectively, of the comparative examples.

TABLE 3

Properties of the inventive examples

| Example | Inv.1 | Inv.2 | Inv.3 | Inv.4 | Inv.5 |
|---|---|---|---|---|---|
| | heco | heco | heco | heco | heco |
| Density | 900 | 905 | 905 | 905 | 905 |
| Melting point DSC; ISO11357° C. | 168 | 168 | 166 | 164 | 166 |
| Vicat A50 (10N); ° C. | >150 | 154 | 150 | 148 | 145 |
| C2 content in the polymer; wt % | 1.4 | 3.6 | 9.0 | 9.0 | 9.0 |
| Xylene soluble; wt % | 4.5 | 14 | 15.5 | 14 | 14.5 |

TABLE 3-continued

Properties of the inventive examples

| Example | Inv.1 | Inv.2 | Inv.3 | Inv.4 | Inv.5 |
|---|---|---|---|---|---|
| Flexural modulus; ISO178, MPa | 2000 | 1400 | 1200 | 1100 | 950 |
| Charpy notched impact 23 ° C.; 179/1eA, kJ/m$^2$ | 29 | 35 | 40 | 7 | 7 |
| Charpy notched impact −20 ° C.; 179/1eA, kJ/m$^2$ | 2 | 1.2 | 4 | 2.5 | 2.5 |
| MFR2 (230 C), g/10 min | 0.3 | 3 | 0.85 | 7 | 5 |

TABLE 4

Properties of the comparative examples

| Example | Comp.1 | Comp.2 |
|---|---|---|
| Melting point DSC; ISO11357-3, ° C. | 143 | 164 |
| Vicat softening point, ° C. | — | — |
| Flexural modulus; ISO178, MPa | 800 | 1400 |
| Charpy notched impact −20 C; 179/1eA, kJ/m$^2$ | <1.0 | <1.0 |
| $MFR_2$ (230 C), g/10 min | 8 | 8 |
| XCS, wt % | | |
| C2 content, wt % | | |

It has surprisingly been found that already at very low incorporation of elastomeric component in the polypropylene provides excellent low temperature properties. Moreover, the claimed XCS, MFR and Vicat softening temperature result in unexpectedly good combination of mechanical and thermal properties, which property combination makes the composition of the invention highly advantageous as layer material for electrical devices, preferably as layer material for layer elements, particularly for layer(s) of backsheet layer element, of photovoltaic modules, as will be shown below.

As to comparative examples, Comp. 2 shows good heat deformation characteristics but have a tendency to crack when the module is exposed to winter climate. Also Comp. 1 shows inferior low temperature performance.

B. Testing of Backsheet Element and Photovoltaic Module-Laminate

The PP copolymers (A) of the invention were tested as a backsheet element as such and when laminated to an encapsulation element.

1. Backsheet
Preparation of Adhesive Layer Composition
The components of the adhesive layer composition:
84.75 wt % of Inv. 2
5 wt % of Exxelor PO-1020 which is a maleic anhydride (0.5-1%) grafted polypropylene supplied by ExxonMobil Chemicals. It has a melt flow rate (2.16 kg, 230° C.) of 430 g/10 minutes and density of 900 kg/m$^3$.
10 wt % of Master Batch titanium oxide
0.1 wt % of UV stabiliser and 0.15 wt % of phenolic antioxidant.

The adhesive layer composition was prepared using a co-rotating twin-screw extruder (type: Coperion ZSK 40, Screw: Nr 001 PP/TV Undercut)) using a temperature setting of; 190-220-225-230-230-230-230-220-210-200° C. and a screw speed of 400 rpm.

Preparation of Inventive PP Back Sheet:
A two layer polypropylene based backsheet was produced by co-extrusion as described below. The final backsheet consists of a thin adhesive layer (with thickness of 20 μm) of the adhesive layer composition as described above and of the actual bulk backsheet layer (with thickness of 280 μm) of the inventive polymer composition inv. 2 as described above.

TABLE 5

Inventive polypropylene based back-sheet

| Layer 1 | Adhesive layer | 20 μm |
|---------|----------------|-------|
| Layer 2 | Inv.2 | 280 μm |

Co-Extrusion:

The inventive 2-layer film is produced on a multilayer cast film line equipped with 3 extruders. All three extruders are equipped with a notched feeding zone and a 3 zone screw with mixing and shear parts. The diameter of the cylinder of extruder A is 40 mm and the screw length 25D. Extruder B has a cylinder diameter of 60 mm and a screw length of 30D and extruder C a cylinder diameter of 45 mm and a screw length of 25D. Each extruder is fed by a gravimetric dosing system. A feed block with lamellas and following distribution was used as co-extrusion adapter: Extruder A 7% (Adhesive layer), extruder C 73% (core layer) and extruder B 20% (core layer). A coat hanger die with automatic die gap regulation was used, die width 800 mm and die gap 0.5 mm. The chill roll unit has a diameter of 450 mm and the $2^{nd}$ cooling roll 250 mm.

The different layers were produced at the same temperature settings:
200-230-250-250-250-250-250° C.

For the thin adhesive layer a screw speed of 7 rpm was used. The thicker bulk layer two extruders were used on giving a 60 um thick layer operated at 15 rpm and the other at 51 rpm giving a 220 um thick layer.

The film production was made at 6.8 m/min and the cast roll had a temperature of 48° C. and the two chill rolls 48 and 21° C.

Figure 2:
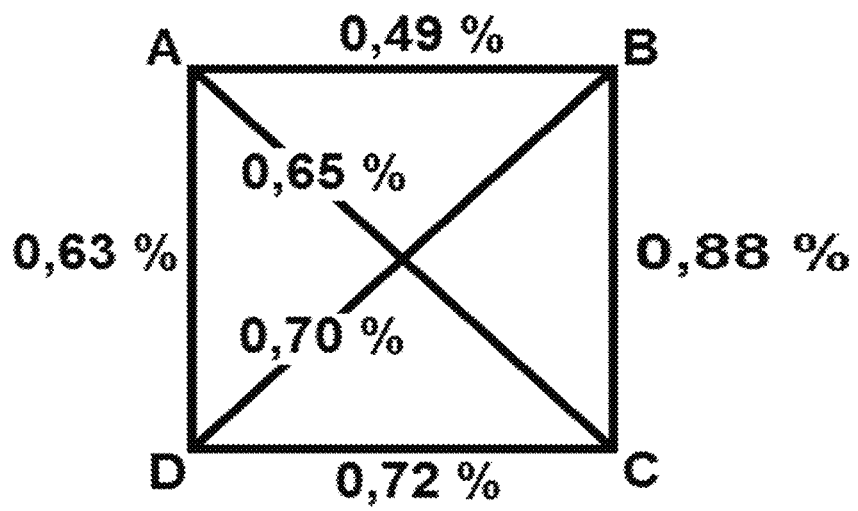
FIG. 2 shows the shrinkage measurement of inventive PP back sheet after 15 min heat treatment at 155° C.

Physical properties of the inventive backsheet is summarized in Table 6 and its shrinking performance in more detail in FIG. 2.

TABLE 6

Properties of inventive polypropylene based back sheet

| Property | | Test method/Comments |
|----------|---|----------------------|
| Melting point, ° C. | 167 | DSC |
| Heat of fusion, J/g | 51 | DSC |
| Tensile strength at Break, MPa | 46 | |
| Elongation at break, % | 630 | |
| Flexural modulus, MPa | 1220 | |
| Shrinkage all direction, % | <1 | More details in Figure a below. |
| Water vapour transmission rate, g/m²/24h | 0.15 | 23° C.m 85% relative humidity |
| Breakdown Voltage, kV | 21.3 | |

Figure a. Shrinkage measurement of inventive PP back sheet after 15 min heat treatment at 155° C.

2. Photovoltaic Module-Laminate

Lamination

The extruded outer and inner encapsulation films (with thickness of 0.45 μm) were cut into 30×30 cm squares and laminates consisting of Glass/outer encapsulant film/crystalline silicon wafer/encapsulant film/back sheet and laminated in a P. Energy laminator type L036 at different conditions outlined in the table 7 below.

Outer and Inner encapsulant film was Mitsui RC02B: Commercial fast cure EVA supplied by Mitsui.

The heat temperature resistance was also controlled in more realistic conditions, by fabrication of photo voltaic modules in a vacuum laminator at different settings.

TABLE 7

Lamination of PV modules based on Glass/EVA encapsulant/Inventive PP back sheet at different lamination conditions.

| Temp [° C.] | Preheating, [s] | Lamination [s] | Pressure [mbar] | Appearance |
|-------------|-----------------|----------------|-----------------|------------|
| 140 | 300 | 660 | 800 | OK, no bubbles, good adhesion, no shrink |
| 145 | 300 | 660 | 800 | OK, no bubbles, good adhesion, no shrink |
| 150 | 300 | 660 | 800 | OK, no bubbles, good adhesion, no shrink |
| 155 | 300 | 660 | 800 | OK, no bubbles, good adhesion, no shrink |
| 160 | 300 | 660 | 800 | Not OK melting of back-sheet resulting in deformation and bad adhesion towards the encapsulation |

The adhesion strength between the EVA encapsulant and the inventive PP-back sheet was evaluated at 1470° C. using the same laminator as used for generating the data in table 7. The lamination was made by 240 s evacuation with pins up, 120 seconds evacuation with pins down, 30 seconds pressing at 800 mbar and 550 seconds vacuum treatments. The adhesion of laminate layers was tested by laminating the EVA encapsulant against the thin adhesive layer side (containing the adhesive promoter and Inv. 2) of the inventive backsheet and also against the actual bulk layer side (containing 100% of Inv. 2) of the inventive backsheet. Outer and inner encapsulant film was Vistasolar EVA 486:10: Commercial fast cure ethylene vinylacetate with a density of 950 kg/m³ uncured and 960 kg/m³ cured, supplied by Eastman Solutia Solar GMBH.

TABLE 8

Adhesion (peel strength) test

| | EVA/thin adhesive layer side of the backsheet | EVA/actual bulk backsheet layer side of the backsheet |
|---|---|---|
| Peel strength, N/cm | 25 | 21 |

The generated data shows that the composition of the invention withstands the upper range of photovoltaic module lamination conditions (155° C.) with only minor shrinkage, no bubble formation and good adhesion towards the encapsulant. The PP backsheet have suitable stiffness and good mechanical properties for back-sheets.

Table 8 shows that the adhesion of the polymer composition as such is good and that the composition of the invention combined with an "adhesive promoting compound" can also be used as an adhesive layer material for further increasing the adhesion, if desired.

Electrical and water vapour migration performance was compared with an established commercial back sheet polyethylene terephthalate based back sheet, Covene Dymat PYE (PET based back sheet).

TABLE 9

Water vapour transmission rate and electrical performance backsheet compared with established commercial product (comparative backsheet).

| Property | Inventive backsheet | Comparative backsheet Covene Dymat PYE |
|---|---|---|
| Thickness, μm | 294 | 315 |
| Water vapour transmission rate, g/m²/24h | 0.15 | 0.70 |
| Electrical breakdown kV/mm | 75 | 70 |

Table 9 shows that the PP based backsheet give excellent water protection and electrical performance.

The invention claimed is:

1. A photovoltaic module comprising a protective top element comprising a glass front sheet, a front encapsulant, at least one photovoltaic element, a rear encapsulant, and a multilayer backsheet element comprising at least one layer comprising a polypropylene composition and an adhesive layer for improving the adhesion of the backsheet element to the rear encapsulant layer element, wherein the polypropylene composition comprises a heterophasic copolymer of propylene (A) which comprises, a polypropylene matrix component and an elastomeric propylene copolymer component which is dispersed in said polypropylene matrix, and wherein the polypropylene composition has a xylene cold soluble (XCS) fraction in amount of 2 to 30 wt %, when measured according to ISO 16152 (at 25° C.), a melt flow rate, $MFR_2$, of 0.2 to 20.0 g/10 min (ISO 1133, 2.16 kg load, 230° C.), and a Vicat softening temperature of at least 145° C., when measured according to ASTM D 1525 method A, wherein the heterophasic copolymer of propylene (A) has xylene cold soluble (XCS) fraction in amount of 2 to 30 wt % and Vicat softening temperature of at least 145° C., and the adhesive layer comprises (a) a blend of the heterophasic copolymer of propylene (A) and a polypropylene comprising polar groups, or (b) the heterophasic copolymer of propylene (A) grafted with polar groups, and wherein the thickness of the multi-layer backsheet element is 0.3 to 2 mm.

2. The photovoltaic module according to claim 1, wherein the polypropylene composition has a flexural modulus of at least 900 MPa, when measured according to ISO178.

3. The photovoltaic module according to claim 1, wherein the polypropylene composition has melting temperature of 158 to 170° C.

4. The photovoltaic module according to claim 1, wherein the heterophasic copolymer of propylene (A) has a comonomer content of 0.5 to 20 wt %, whereby the comonomer is selected from ethylene and C4-C8 alpha comonomer(s).

5. The photovoltaic module according to claim 1, wherein the polypropylene composition has a $MFR_2$ of 0.2 to 10.0 g/10 min.

6. The photovoltaic module according to claim 1, wherein the polypropylene matrix component of the heterophasic copolymer of propylene (A) is a homopolymer or random copolymer of propylene.

7. The photovoltaic module according to claim 1, wherein the at least one layer comprising the polypropylene composition is a laminated layer of the multilayer backsheet element.

8. The photovoltaic module according to claim 1, wherein the at least one layer comprising the polypropylene composition is a coextruded layer of the multilayer backsheet element.

9. The photovoltaic module according to claim 1, wherein layers of the multilayer backsheet element of the photovoltaic module are free from fluoride containing polymer.

10. The photovoltaic module according to claim 1, wherein the least one photovoltaic element is at least one element of photovoltaic cell(s).

11. The photovoltaic module according to claim 1, wherein the adhesive layer comprises a blend of the heterophasic copolymer of propylene (A) and a polypropylene grafted with maleic anhydride.

12. The photovoltaic module according to claim 1, wherein the adhesive layer comprises the heterophasic copolymer of propylene (A) grafted with maleic anhydride.

* * * * *